: US 9,620,677 B2
(45) Date of Patent: *Apr. 11, 2017

(12) United States Patent
Yoo

(54) DIODE HAVING VERTICAL STRUCTURE

(71) Applicant: LG INNOTEK CO., LTD., Seoul (KR)

(72) Inventor: Myung Cheol Yoo, Pleasanton, CA (US)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/636,933

(22) Filed: Mar. 3, 2015

(65) Prior Publication Data

US 2015/0179886 A1    Jun. 25, 2015

Related U.S. Application Data

(63) Continuation of application No. 13/951,344, filed on Jul. 25, 2013, now Pat. No. 9,000,468, which is a (Continued)

(51) Int. Cl.
| | |
|---|---|
| H01L 33/00 | (2010.01) |
| H01L 33/32 | (2010.01) |
| H01L 33/10 | (2010.01) |
| H01L 33/46 | (2010.01) |
| H01S 5/30 | (2006.01) |
| H01L 33/06 | (2010.01) |
| H01L 33/12 | (2010.01) |

(Continued)

(52) U.S. Cl.
CPC ........ *H01L 33/325* (2013.01); *H01L 33/0075* (2013.01); *H01L 33/0079* (2013.01); *H01L 33/06* (2013.01); *H01L 33/10* (2013.01); *H01L 33/12* (2013.01); *H01L 33/32* (2013.01); *H01L 33/42* (2013.01); *H01L 33/46* (2013.01); *H01L 33/62* (2013.01); *H01S 5/3013* (2013.01); *H01L 33/405* (2013.01)

(58) Field of Classification Search
None
See application file for complete search history.

(56) References Cited

U.S. PATENT DOCUMENTS

| 4,236,296 A | 12/1980 | Woolhouse et al. |
| 4,704,369 A | 11/1987 | Nath et al. |

(Continued)

FOREIGN PATENT DOCUMENTS

| DE | 20009283 | 12/2000 |
| DE | 10056999 | 5/2001 |

(Continued)

OTHER PUBLICATIONS

Robert Q. Wang: "PBGA Cost Reduction by Reducing Plated Au Thickness of Substrate Pads", Jan. 1, 2010 (Jan. 1, 2013 ), pp. 877-882, XP055216361,ISSN: 1938-5862, DOI: 101149/1.3360724.

(Continued)

*Primary Examiner* — Minh-Loan Tran
(74) *Attorney, Agent, or Firm* — Birch, Stewart, Kolasch & Birch, LLP

(57) ABSTRACT

A light emitting diode includes a conductive layer, an n-GaN layer on the conductive layer, an active layer on the n-GaN layer, a p-GaN layer on the active layer, and a p-electrode on the p-GaN layer. The conductive layer is an n-electrode.

17 Claims, 7 Drawing Sheets

Related U.S. Application Data continuation of application No. 13/216,531, filed on Aug. 24, 2011, now Pat. No. 8,592,846, which is a continuation of application No. 12/941,627, filed on Nov. 8, 2010, now Pat. No. 8,008,681, which is a continuation of application No. 12/840,840, filed on Jul. 21, 2010, now Pat. No. 7,915,632, which is a continuation of application No. 12/654,894, filed on Jan. 7, 2010, now Pat. No. 7,863,638, which is a continuation of application No. 11/593,470, filed on Nov. 7, 2006, now Pat. No. 7,821,021, which is a continuation of application No. 09/983,994, filed on Oct. 26, 2001, now Pat. No. 7,148,520.

(51) Int. Cl.
  H01L 33/42      (2010.01)
  H01L 33/62      (2010.01)
  H01L 33/40      (2010.01)

(56) References Cited

U.S. PATENT DOCUMENTS

| | | |
|---|---|---|
| 5,040,044 A | 8/1991 | Noguchi et al. |
| 5,103,269 A | 4/1992 | Tomomura et al. |
| 5,132,750 A | 7/1992 | Kato et al. |
| 5,369,289 A | 11/1994 | Tamaki et al. |
| 5,514,903 A | 5/1996 | Inoue et al. |
| 5,593,815 A | 1/1997 | Ahn |
| 5,684,309 A | 11/1997 | McIntosh et al. |
| 5,739,554 A | 4/1998 | Edmond et al. |
| 5,798,536 A | 8/1998 | Tsutsui |
| 5,798,537 A | 8/1998 | Nitta |
| 5,880,486 A | 3/1999 | Nakamura et al. |
| 5,904,548 A | 5/1999 | Orcutt |
| 5,929,466 A | 7/1999 | Ohba et al. |
| 5,939,735 A | 8/1999 | Tsutsui et al. |
| 5,952,681 A | 9/1999 | Chen |
| 5,977,566 A | 11/1999 | Okazaki et al. |
| 6,017,774 A | 1/2000 | Yuasa et al. |
| 6,026,111 A | 2/2000 | Jiang et al. |
| 6,051,503 A | 4/2000 | Bhardwaj et al. |
| 6,057,565 A | 5/2000 | Yoshida et al. |
| 6,063,527 A | 5/2000 | Nishikawa et al. |
| 6,069,021 A | 5/2000 | Terashima et al. |
| 6,078,064 A | 6/2000 | Ming-Jiunn et al. |
| 6,097,040 A | 8/2000 | Morimoto et al. |
| 6,100,545 A | 8/2000 | Chiyo et al. |
| 6,107,647 A | 8/2000 | Matsumoto |
| 6,120,600 A | 9/2000 | Edmond et al. |
| 6,121,636 A | 9/2000 | Morita et al. |
| 6,121,638 A | 9/2000 | Rennie et al. |
| 6,130,147 A | 10/2000 | Major et al. |
| 6,146,916 A | 11/2000 | Nanishi et al. |
| 6,147,363 A | 11/2000 | Udagawa |
| 6,156,584 A | 12/2000 | Itoh et al. |
| 6,172,382 B1 | 1/2001 | Nagahama et al. |
| 6,185,238 B1 | 2/2001 | Onomura et al. |
| 6,194,742 B1 | 2/2001 | Kern et al. |
| 6,211,089 B1 | 4/2001 | Kim et al. |
| 6,242,276 B1 | 6/2001 | Baek et al. |
| 6,242,761 B1 | 6/2001 | Fujimoto et al. |
| 6,249,534 B1 | 6/2001 | Itoh et al. |
| 6,252,255 B1 | 6/2001 | Ueta et al. |
| 6,274,399 B1 | 8/2001 | Kern et al. |
| 6,281,524 B1 | 8/2001 | Yamamoto et al. |
| 6,291,257 B1 | 9/2001 | Kadota |
| 6,329,216 B1 | 12/2001 | Matsumoto et al. |
| 6,335,217 B1 | 1/2002 | Chiyo et al. |
| 6,358,770 B2 | 3/2002 | Itoh et al. |
| 6,360,687 B1 | 3/2002 | Yanagisawa et al. |
| 6,365,429 B1 | 4/2002 | Kneissl et al. |
| 6,375,790 B1 | 4/2002 | Fenner |
| 6,379,985 B1 | 4/2002 | Cervantes et al. |
| 6,388,275 B1 | 5/2002 | Kano |
| 6,404,792 B1 | 6/2002 | Yamamoto et al. |
| 6,426,512 B1 | 7/2002 | Ito et al. |
| 6,448,102 B1 | 9/2002 | Kneissl et al. |
| 6,456,638 B1 | 9/2002 | Fukunaga |
| 6,468,902 B2 | 10/2002 | Kawai |
| 6,479,839 B2 | 11/2002 | Nikolaev et al. |
| 6,486,042 B2 | 11/2002 | Gehrke et al. |
| 6,488,767 B1 | 12/2002 | Xu et al. |
| 6,489,250 B1 | 12/2002 | Hwang et al. |
| 6,492,661 B1 | 12/2002 | Chien et al. |
| 6,495,894 B2 | 12/2002 | Shibata et al. |
| 6,500,689 B2 | 12/2002 | Uemura et al. |
| 6,504,180 B1 | 1/2003 | Heremans et al. |
| 6,508,878 B2 | 1/2003 | Kim et al. |
| 6,518,602 B1 * | 2/2003 | Yuasa ............ H01L 33/325 257/102 |
| 6,526,083 B1 | 2/2003 | Kneissl et al. |
| 6,555,405 B2 | 4/2003 | Chen et al. |
| 6,562,648 B1 | 5/2003 | Wong et al. |
| 6,564,445 B1 | 5/2003 | Hori et al. |
| 6,570,186 B1 | 5/2003 | Uemura et al. |
| 6,576,933 B2 | 6/2003 | Nitta et al. |
| 6,579,802 B1 | 6/2003 | Pierson et al. |
| 6,580,099 B2 | 6/2003 | Nakamura et al. |
| 6,586,149 B2 | 7/2003 | Kawamura et al. |
| 6,586,777 B1 | 7/2003 | Yuasa et al. |
| 6,597,716 B1 | 7/2003 | Takatani |
| 6,614,060 B1 | 9/2003 | Wang et al. |
| 6,627,921 B2 | 9/2003 | Wong et al. |
| 6,638,846 B2 | 10/2003 | Iwata et al. |
| 6,639,925 B2 | 10/2003 | Niwa et al. |
| 6,693,352 B1 | 2/2004 | Huang et al. |
| 6,693,935 B2 | 2/2004 | Tojo et al. |
| 6,720,583 B2 | 4/2004 | Nunoue et al. |
| 6,744,196 B1 | 6/2004 | Jeon |
| 6,765,232 B2 | 7/2004 | Kaminishi et al. |
| 6,787,435 B2 | 9/2004 | Gibb et al. |
| 6,791,119 B2 | 9/2004 | Slater et al. |
| 6,803,603 B1 | 10/2004 | Nitta et al. |
| 6,812,071 B2 | 11/2004 | Hayashi et al. |
| 6,815,725 B2 | 11/2004 | Sugawara et al. |
| 6,819,701 B2 | 11/2004 | Henrichs |
| 6,841,802 B2 | 1/2005 | Yoo et al. |
| 6,869,820 B2 | 3/2005 | Chen |
| 6,878,563 B2 | 4/2005 | Bader et al. |
| 6,949,395 B2 | 9/2005 | Yoo |
| 6,992,334 B1 | 1/2006 | Wierer et al. |
| 7,067,849 B2 | 6/2006 | Yoo |
| 7,087,933 B2 | 8/2006 | Takeda et al. |
| 7,109,529 B2 | 9/2006 | Uemura et al. |
| 7,148,520 B2 | 12/2006 | Yoo |
| 7,205,576 B2 | 4/2007 | Song et al. |
| 7,250,638 B2 | 7/2007 | Lee et al. |
| 7,265,392 B2 | 9/2007 | Hahn et al. |
| 7,291,865 B2 | 11/2007 | Kojima et al. |
| 7,294,521 B2 | 11/2007 | Yoo |
| 7,319,247 B2 | 1/2008 | Bader et al. |
| 7,371,597 B2 | 5/2008 | Yoo |
| 7,384,808 B2 | 6/2008 | Liu et al. |
| 7,462,881 B2 | 12/2008 | Lee et al. |
| 7,498,611 B2 | 3/2009 | Eitoh et al. |
| 7,518,153 B2 | 4/2009 | Usuda et al. |
| 7,563,629 B2 | 7/2009 | Lee et al. |
| 7,566,639 B2 | 7/2009 | Kohda |
| 7,569,865 B2 | 8/2009 | Lee et al. |
| 7,576,368 B2 | 8/2009 | Lee et al. |
| 7,582,912 B2 | 9/2009 | Yoo |
| 7,588,952 B2 | 9/2009 | Lee et al. |
| 7,649,210 B2 | 1/2010 | Yoo |
| 7,682,854 B2 | 3/2010 | Yoo |
| 7,691,650 B2 | 4/2010 | Yoo |
| 7,741,653 B2 | 6/2010 | Kamei |
| 7,772,020 B2 | 8/2010 | Yoo |
| 7,816,705 B2 | 10/2010 | Lee et al. |
| 7,821,021 B2 | 10/2010 | Yoo |
| 7,863,638 B2 | 1/2011 | Yoo |
| 7,875,474 B2 | 1/2011 | Muraki et al. |
| 7,915,632 B2 | 3/2011 | Yoo |
| 7,928,465 B2 | 4/2011 | Lee et al. |

(56) References Cited

U.S. PATENT DOCUMENTS

| | | |
|---|---|---|
| 7,939,849 B2 | 5/2011 | Yoo |
| 8,008,681 B2 | 8/2011 | Yoo |
| 8,022,386 B2 | 9/2011 | Yoo |
| 8,106,417 B2 | 1/2012 | Yoo |
| 8,236,585 B2 | 8/2012 | Yoo |
| 8,288,787 B2 | 10/2012 | Yoo |
| 8,294,172 B2 | 10/2012 | Yoo |
| 8,309,982 B2 | 11/2012 | Hanawa et al. |
| 8,368,115 B2 | 2/2013 | Yoo |
| 8,384,091 B2 | 2/2013 | Yoo |
| 8,384,120 B2 | 2/2013 | Lee et al. |
| 8,445,921 B2 | 5/2013 | Yoo |
| 8,502,256 B2 | 8/2013 | Lee |
| 2001/0000335 A1 | 4/2001 | Yamada |
| 2001/0010941 A1 | 8/2001 | Morita |
| 2001/0023946 A1 | 9/2001 | Ueta et al. |
| 2001/0026950 A1 | 10/2001 | Sunakawa et al. |
| 2001/0028062 A1 | 10/2001 | Uemura et al. |
| 2001/0030316 A1 | 10/2001 | Kuramoto |
| 2001/0030329 A1 | 10/2001 | Ueta et al. |
| 2001/0041410 A1 | 11/2001 | Franz |
| 2001/0042866 A1 | 11/2001 | Coman et al. |
| 2002/0037602 A1 | 3/2002 | Okada et al. |
| 2002/0117672 A1 | 8/2002 | Chu et al. |
| 2002/0117681 A1 | 8/2002 | Weeks et al. |
| 2002/0117695 A1 | 8/2002 | Borges et al. |
| 2002/0123164 A1 | 9/2002 | Slater, Jr. et al. |
| 2002/0137244 A1 | 9/2002 | Chen et al. |
| 2002/0137249 A1 | 9/2002 | Ishida et al. |
| 2002/0146854 A1 | 10/2002 | Koide et al. |
| 2002/0173062 A1 | 11/2002 | Chen et al. |
| 2002/0177251 A1 | 11/2002 | Ye et al. |
| 2003/0015713 A1 | 1/2003 | Yoo |
| 2003/0032297 A1 | 2/2003 | Lindstrom et al. |
| 2003/0073321 A1 | 4/2003 | Boiteux et al. |
| 2003/0077847 A1 | 4/2003 | Yoo |
| 2003/0080344 A1 | 5/2003 | Yoo |
| 2003/0122141 A1 | 7/2003 | Wong et al. |
| 2003/0151058 A1 | 8/2003 | Uemura et al. |
| 2003/0189212 A1 | 10/2003 | Yoo |
| 2003/0189215 A1 | 10/2003 | Lee et al. |
| 2003/0205717 A1 | 11/2003 | Khare et al. |
| 2003/0213969 A1 | 11/2003 | Wang et al. |
| 2004/0000672 A1 | 1/2004 | Fan et al. |
| 2004/0051105 A1 | 3/2004 | Tsuda et al. |
| 2004/0169181 A1 | 9/2004 | Yoo |
| 2004/0169189 A1 | 9/2004 | Jeon |
| 2005/0093004 A1 | 5/2005 | Yoo |
| 2005/0098792 A1 | 5/2005 | Lee et al. |
| 2006/0006400 A1 | 1/2006 | Yoo |
| 2006/0027818 A1 | 2/2006 | Yoo |
| 2006/0071226 A1 | 4/2006 | Kojima et al. |
| 2006/0071230 A1 | 4/2006 | Lee et al. |
| 2006/0091420 A1 | 5/2006 | Yoo |
| 2006/0094207 A1 | 5/2006 | Yoo |
| 2006/0097277 A1 | 5/2006 | Yoo |
| 2006/0099730 A1 | 5/2006 | Lee et al. |
| 2006/0244001 A1 | 11/2006 | Lee et al. |
| 2007/0012944 A1 | 1/2007 | Bader et al. |
| 2007/0018173 A1 | 1/2007 | Yoo |
| 2007/0057273 A1 | 3/2007 | Yoo |
| 2007/0172973 A1 | 7/2007 | Yoo |
| 2007/0269913 A1 | 11/2007 | Kim et al. |
| 2007/0290224 A1 | 12/2007 | Ogawa |
| 2007/0295986 A1 | 12/2007 | Lee et al. |
| 2008/0001166 A1 | 1/2008 | Lee et al. |
| 2008/0064132 A1 | 3/2008 | Yoo |
| 2008/0128733 A1 | 6/2008 | Yoo |
| 2008/0182384 A1 | 7/2008 | Hata |
| 2009/0008654 A1 | 1/2009 | Nagai |
| 2009/0072264 A1 | 3/2009 | Yoo |
| 2009/0121241 A1 | 5/2009 | Keller et al. |
| 2009/0267100 A1 | 10/2009 | Miyake et al. |
| 2009/0278140 A1 | 11/2009 | Huang et al. |
| 2009/0278161 A1 | 11/2009 | Lee et al. |
| 2010/0012956 A1 | 1/2010 | Yoo |
| 2010/0109020 A1 | 5/2010 | Yoo |
| 2010/0117096 A1 | 5/2010 | Yoo et al. |
| 2010/0127274 A1 | 5/2010 | Yoo |
| 2010/0129943 A1 | 5/2010 | Yoo |
| 2010/0171125 A1 | 7/2010 | Yoo |
| 2010/0207145 A1 | 8/2010 | Yoo |
| 2010/0314607 A1 | 12/2010 | Yoo |
| 2011/0095331 A1 | 4/2011 | Hanawa et al. |
| 2011/0193128 A1 | 8/2011 | Lee et al. |
| 2011/0220948 A1 | 9/2011 | Yoo |
| 2011/0309400 A1 | 12/2011 | Fukushima et al. |
| 2012/0098023 A1 | 4/2012 | Weng et al. |
| 2013/0134465 A1 | 5/2013 | Yoo |
| 2013/0146928 A1 | 6/2013 | Inoue et al. |
| 2013/0240945 A1 | 9/2013 | Aoki et al. |
| 2013/0260490 A1 | 10/2013 | Shatalov et al. |
| 2013/0328057 A1 | 12/2013 | Yu et al. |
| 2014/0124730 A1 | 5/2014 | Choi et al. |

FOREIGN PATENT DOCUMENTS

| | | |
|---|---|---|
| EP | 0622858 A2 | 11/1994 |
| EP | 0852816 A2 | 7/1998 |
| EP | 0892443 | 1/1999 |
| EP | 1017113 A1 | 7/2000 |
| GB | 2352326 | 1/2001 |
| JP | 02290084 | 11/1990 |
| JP | 03-20091 A | 1/1991 |
| JP | H05129658 A | 5/1993 |
| JP | 7-273368 | 10/1995 |
| JP | H0832116 A | 2/1996 |
| JP | 9-307189 | 11/1997 |
| JP | 10-044139 | 2/1998 |
| JP | 10-114600 A | 5/1998 |
| JP | 10-117016 A | 5/1998 |
| JP | 10125956 A | 5/1998 |
| JP | 10-247747 A | 9/1998 |
| JP | 10-270761 A | 10/1998 |
| JP | H10270754 A | 10/1998 |
| JP | 10-303460 A | 11/1998 |
| JP | 10321913 | 12/1998 |
| JP | H111399 A | 1/1999 |
| JP | 11-126925 | 5/1999 |
| JP | 11168236 | 6/1999 |
| JP | 11-214744 A | 8/1999 |
| JP | 11238913 | 8/1999 |
| JP | 11-243251 A | 9/1999 |
| JP | 11-261105 A | 9/1999 |
| JP | 2000114595 A | 4/2000 |
| JP | 2000174333 A | 6/2000 |
| JP | 2000-244068 A | 9/2000 |
| JP | 2000-261035 A | 9/2000 |
| JP | 2000323797 | 11/2000 |
| JP | 2001-44490 A | 2/2001 |
| JP | 2001-77476 A | 3/2001 |
| JP | 2001077476 | 3/2001 |
| JP | 2001-102633 | 4/2001 |
| JP | 2001-119104 | 4/2001 |
| JP | 2001144321 A | 5/2001 |
| JP | 2001-217456 A | 8/2001 |
| JP | 2001210868 | 8/2001 |
| JP | 2001-244503 | 9/2001 |
| JP | 2001-274507 | 10/2001 |
| JP | 2001-284642 | 10/2001 |
| JP | 2001-313422 | 11/2001 |
| JP | 2001339100 | 12/2001 |
| JP | 2001-44491 A | 2/2011 |
| KR | 10-1998-0086740 | 12/1998 |
| WO | 97-12386 A2 | 4/1997 |
| WO | 0147038 A1 | 6/2001 |
| WO | WO 03/015176 A1 | 2/2003 |

OTHER PUBLICATIONS

Nakamura, Shuji "Superbright Green InGaN Single-Quantum-Well-Structure Light-Emitting Diodes" Jpn. J. Appl. Phys. vol. 34, Part 2, No. 1 OB Oct. 15, 1995 pp. L 1332-L 1335.

(56) References Cited

OTHER PUBLICATIONS

Kim, D. W. "A study of transparent indium tin oxide (ITO) contact to p-GaN" Thin Solid Films 398-399 Nov. 2001 pp. 87-92.
Song, Jun. "Ohmic-Contact Technology for GaN-Based Light-Emitting Diodes: Role of P-type contact" IEEE Trans. on Elect. Dev. vol. 57, No. 1 Jan. 2010 pp. 42-59.
Qiao, D. "A study of the Au/Ni ohmic contact on p-GaN" jour. of Appl. Physics 88, 4196 Oct. 1, 2000 pp. 4196-2000.
Jang, Ja-Soon "Ohmic contacts to p-type GaN using a Ni/Pt/Au metallization scheme" J. Vac. Sci. Techno I. B 16, 3105 Dec. 1998 pp. 3105-3107.
Chu, Chen-Fu "Low-resistance ohmic contacts on p-type GaN using Ni/Pd/Au metallization" Appl. Phys. Lett. 77, 3423 Nov. 20, 2000 pp. 3423-3425.
Kim, Taek "Low Resistance Contacts to P-type GaN" Mat. Res. Soc. Symp. Proc. vol. 468 copyright 1997 pp. 427-430.
Kim, Jong K. "Low resistance Pd/Au ohmic contacts top-type GaN using surface treatment" App. Phys. Lett. 73, 2953 Nov. 16, 1998 pp. 2953-2955.
Zhou, L. "Low Resistance Ti/Pt/Au ohmic contacts top-type GaN" Appl. Phys. Lett. 76, 3451 Jun. 5, 2000 pp. 3451-3453.
Motayed, Abhishek "Two-step surface treatment technique: Realization of nonalloyed low-resistance Ti/Al/Ti/Au ohmic contact to n-GaN" J. Vac. Sci. Tech. B 22(2) Apr. 2004 pp. 663-667.
Fung, A. K. "A Study of the Electrical Characteristics of Various Metals on p-Type GaN for Ohmic contacts" Joun. of Elec. Mat. vol. 28, No. 5 May 1, 1999 pp. 572-579.
Cho, H. K. "Characterization of Pd/Ni/Au ohmic contacts on p-GaN" Solid-State Elec. 49 copyright 2005 pp. 774-778.
Fan, Zhifang "Very low resistance multilayer Ohmic contact to nGaN" Appl. Phys. Left 68, 1672 Mar. 18, 1996.
Wolf, S., "Silicon Processing for the VLSI Era", vol. 12nd ed. (200), pp. 698 and 708.
Kwok, C.K., et al. "Designing an External Efficient of Over 30% for Light Emitting Diode", IEEE, 1998, pp. 187-188.
Sung, Y.J. et al. "High rate etching of sapphire wafer using Cl2/Bcl3/Ar inductively coupled plasmas", Materials Science 7 Engineering 882 (2001) p. 50-52.
Ghosh, D.S. "Widely transparent electrodes based on ultrathin metals" Opt. Lett.vol. 34, Iss. 3 Feb. 21, 2009 pp. 325-327.
Notification of Transmittal of International Preliminary Examination Report.
Continuous-Wave Operation of InGaN Multiple-Quantum-Well Laser Diodes on Copper Substrates Obtained by Laser Liftoff IEEE Journal on Selected Topics in Quantum Electronics vol. 7 No. 2 Mar. Apr. 2001.
Continuous-Wave InGaN Multiple-Quantum-Well Laser Diodes on Copper Substrates Applied Physics Letters vol. 78 No. 9 Feb. 26, 2001.
The integration of InxGa1-xN Multiple-Quantum-Well Laser Diodes with Copper Substrates by Laser Lift-Off Jpn. J. Appl. Phys. vol. 39 (2000) pp. L 1203-L 1205 Part 2 No. 12A Dec. 1, 2000.
Michael Kneissl et al. "Continuous-Wave Operation of InGAN Multiple-Quantum-Well Laser Diodes on Copper Substrates Obtained by Laser Liftoff" IEEE Journal on Selected Topics in Quantum Electronics vol. 7 No. 2 Mar. Apr. 2001 pp. 188-191.
William S. Wong et al. "Continuous-wave InGaN Multiple-Quantum-Well Laser Diodes on Copper Substrates" Applied Physics Letters vol. 78 No. 9 Feb. 2001 pp. 1198-1200.
William S. Wong et al "The Integration of InxGa1-xN Multiple-Quantum-Well Laser Diodes with Copper Substrates by Laser Lift-Off" Jpn. J. Appl. Phys. vol. 39 Dec. 2000 pp. 1203-1205.
Crawford M H et al: "Design and performance of nitride-based UV LEDs" Wide-Band Gap Eletrionic Device. Symposium Apr. 2000.
Park et al. "Growth of GaN Layer from the Single-Source Precursor (Et2GaNH2)3" Chem. Matter vol. 10 pp. 2251-2257 1998.

\* cited by examiner

DIODE HAVING VERTICAL STRUCTURE

CROSS-REFERENCE TO RELATED APPLICATIONS

This application is a continuation of, and claims the benefit of, U.S. application Ser. No. 13/951,344, filed Jul. 25, 2013, which is a continuation of Ser. No. 13/216,531, filed Aug. 24, 2011 (now U.S. Pat. No. 8,592,846), which is a continuation of Ser. No. 12/941,627, filed Nov. 8, 2010 (now U.S. Pat. No. 8,008,681), which is a continuation of Ser. No. 12/840,840, filed Jul. 21, 2010 (now U.S. Pat. No. 7,915,632), which is a continuation of Ser. No. 12/654,894, filed Jan. 7, 2010 (now U.S. Pat. No. 7,863,638), which is a continuation of Ser. No. 11/593,470, filed Nov. 7, 2006 (now U.S. Pat. No. 7,821,021), which is a continuation of Ser. No. 09/983,994, filed Oct. 26, 2001 (now U.S. Pat. No. 7,148,520), all of which are incorporated by reference in their entirety for all purposes as if fully set forth herein.

BACKGROUND OF THE INVENTION

Field of the Invention

The present invention relates to diodes, and more particularly, to a vertical structure light emitting diode (LED). Although the present invention is discussed with reference to a GaN-based light emitting diode, the present invention can be used for various types of light emitting diodes, and can be further used in a wide range of applications including, for example, other types of diodes such as laser diodes Discussion of the Related Art Light emitting diodes, commonly referred to as "LEDs." are semiconductor devices which convert electrical power into emitted light. It is well known in the art that when electrons transition between their allowed energy levels in atoms or molecules, these transitions are always accompanied by a gain or loss of specific quanta of energy. In a light emitting diode, the generation or injection of a current of either electrons or holes across the diode junction encourages such electronic transitions, which in turn result in either vibrational energy or light, or both. As is further known in the art, the color of light that can be produced by a light emitting diode is generally limited by the characteristics of the semiconductor material, most significantly by the bandgap which represents the energy level differences between the valence band and conduction band of individual atoms.

Gallium-Nitride (GaN) has recently gained much attention from researchers in the field of LEDs, since its material characteristics of a wide and direct band gap are suitable for making a blue LED, which has been considered the most difficult one to fabricate among other red and green LEDs Accordingly, GaN-based opto-electronic device technology has rapidly evolved from the realm of device research and development to commercial reality, since these devices have been introduced in the market in 1994. The efficiency of GaN light emitting diodes, for example, has surpassed that of incandescent lighting, and is now comparable with that of fluorescent lighting.

The market growth for GaN-based devices has been far exceeding than the industrial market prediction every year. Despite of such rapid speed of the development, it is still too expensive to realize a full color display with GaN-based devices. This is because the manufacturing cost of blue LEDs, which are essential to realizing a full color display, is high compared with the other visible LEDs. The wafer size for making blue LEDs is limited to 2 inches, and the process of growing a GaN epitaxial layer is more difficult than other semiconductor materials. Therefore, it is crucial that developments of mass production technology, without sacrificing performance, are the main issue in reducing the manufacturing costs of blue LEDs, thereby to utilize full color displays using GaN LEDs at an inexpensive price, the efficiency of which is far better than currently available In general, GaN-based LEDs are fabricated with a lateral structure using a sapphire substrate, since sapphire is the material that makes the GaN epitaxial layer grow with fewer defects than other materials as a substrate. Since sapphire is an electrical insulator, the lateral type LEDs having both n and p metal contacts on the topside is inevitable to inject current flows in the MQW layer.

FIG. 1 schematically illustrates conventional lateral type LED device. Referring to FIG. 1, the convention lateral type LED includes a substrate 100, such as sapphire. A buffer layer 120, which is optional and is made of, for example, gallium nitride (GaN), is formed on the substrate 100. An n-type GaN layer 140 is formed on the buffer layer 120. An active layer such as a multiple quantum well (MQW) layer 160 of aluminum-indium-gallium-nitride (AlInGaN), for example, is formed on the n-type GaN layer 140. A p-type GaN layer 180 is formed on the active layer 160. A transparent conductive layer 220 is formed on the p-GaN layer 180. The transparent conductive layer 220 may be made of any suitable material including, for example, Ni/Au or indium-tin-oxide (ITO). A p-type electrode 240 is then formed on one side of the transparent conductive layer 220. The p-type electrode 240 may be made of any suitable material including, for example, Ni/Au, Pd/Au, Pd/Ni and Pt. A pad 260 is formed on the p-type electrode 240. The pad may be made of any suitable material including, for example, Au. The transparent conductive layer 220, the p-GaN layer 180, the active layer 160 and the n-GaN layer 140 are all etched at one portion to form an n-electrode 250 and pad 270.

Since sapphire is an insulator, the n-GaN layer should be exposed to form an n-metal contact. A dry-etching method is generally used, since GaN is not etched by a chemical etching method. This is a significant disadvantage since additional lithography and stripping processes are required. In addition, plasma damages on the GaN surface are often sustained during a dry-etch process. Moreover, the lateral device structure requires a large device dimension since two metal contacts need to be formed on top of the device. Furthermore, the lateral structure device is vulnerable to static electricity because two metal electrodes are positioned close each other. Thus, the lateral structure GaN based LEDs may not be suitable for high voltage applications, such as traffic indicators and signal lights.

Currently, a vertical structure of GaN-based LEDs is fabricated by Cree Research Inc. using a silicon carbide (SiC) substrate. Due to the high manufacturing cost, however, the LEDs with SiC substrate are not suitable for mass production. In addition, SiC is known in the art to be very sensitive to hydrogen atoms, which exist during the epitaxial growth of GaN layer by metal organic chemical vapor deposition (MOCVD) method, which is the most common way of growing GaN epitaxial layers considering the epitaxial film quality. An additional process called "surface treatment" is necessary in order to grow high quality GaN-based epitaxial films. Furthermore, the GaN based LEDs with a SiC substrate requires an additional conductive buffer layer on the SiC substrate before growing the GaN epitaxial layer, which is not necessary for lateral structure devices.

SUMMARY OF THE INVENTION

Accordingly, the present invention is directed to a method of fabricating simple vertical structure LEDs for mass production that substantially obviates one or more of the problems due to limitations and disadvantages of the related art.

An advantage of the present invention is to increase the number of LED devices fabricated within a limited wafer area.

Another advantage of the present invention is LED devices having a simplified fabrication process steps.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of making light emitting diodes comprises forming a buffer GaN layer by vapor phase epitaxy (VPE) on a sapphire substrate; forming an n-GaN epitaxial layer by MOCVD on the buffer GaN; forming a multi-quantum-well (MQW) layer on the n-GaN epitaxial layer; forming a p-GaN layer on the MQW layer by MOCVD; a step of separating the sapphire substrate from other layers; forming p and n metal contacts; forming a metal transparent contact on the side of the p-GaN layer; and forming a metal pad on the p-GaN layer.

In another aspect, a method of making light emitting diodes comprises forming, a buffer GaN layer by VPE on a sapphire substrate; forming an undoped GaN layer by VPE on the buffer GaN layer; forming an n-GaN layer by VPE on the undoped GaN layer; forming a n-GaN epitaxial layer by MOCVD on the n-GaN grown by VPE; forming a MQW layer on the n-GaN epitaxial layer; forming a p-GaN layer on the MQW layer by MOCVD; a step of separating the sapphire substrate from other layers; forming p and n metal contacts; forming a metal transparent contact on the p-GaN layer; and forming a metal pad on the p-GaN layer.

In another aspect, a method. of making light emitting diodes comprises forming a buffer GaN layer by VPE on a sapphire substrate; forming an n-GaN epitaxial layer by MOCVD on the buffer GaN layer; forming a MQW layer on the n-GaN epitaxial layer; forming a p-AlGaN cladding layer on the MQW layer by MOCVD; forming a p-GaN conducting layer on the p-AlGaN layer by MOCVD; a step of separating the sapphire substrate from other layers; forming p and n metal contacts; forming a metal transparent contact on the p-GaN layer; and forming a metal pad on the p-GaN layer.

In a further aspect, a method of making light emitting diodes comprises forming a buffer GaN layer by VPE on a sapphire substrate; forming an undoped GaN layer by VPE on the buffer GaN layer; forming an n-GaN layer by VPE on the undoped GaN layer; forming a n-GaN epitaxial layer by MOCVD on the n-GaN grown by VPE; forming a MQW layer on the n-GaN epitaxial layer; forming a p-AlGaN cladding layer on the MQW layer by MOCVD; forming a p-GaN conducting layer on the p-AlGaN layer by MOCVD; a step of separating the sapphire substrate from other layers; forming p and n metal contacts; forming a metal transparent contact on the p-GaN layer; and forming a metal pad on the p-GaN layer.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the present invention, examples of which are illustrated in the accompanying drawings.

Figure 1:
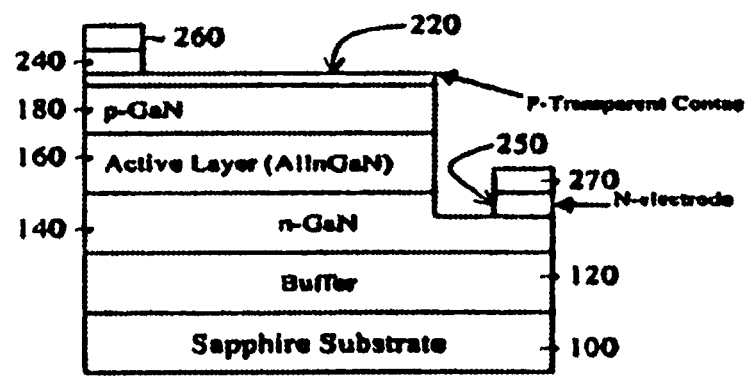
FIG. 1 shows a conventional lateral structure LED.
Figure 2:
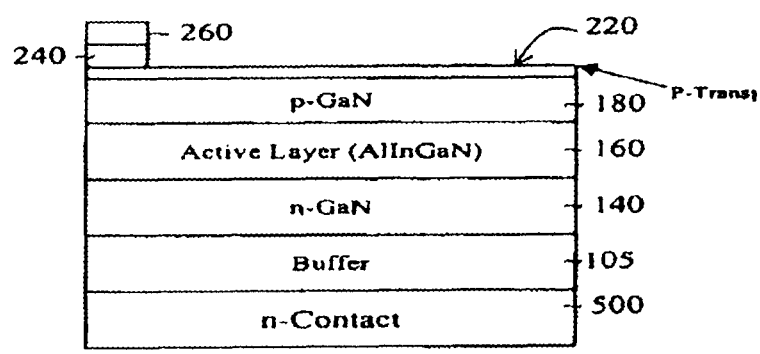
FIG. 2 shows a vertical structure LED according one embodiment of the present invention.

FIG. 2 shows a vertical structure light emitting diode in accordance with one embodiment of the present invention. Referring to FIG. 2, the vertical LED includes an re-contact 500. A buffer layer made of GaN 105 is on the n-contact 500. An n-GaN layer 140 is on the buffer layer 105. An active layer 160 made of, for example, a multiple quantum well (MQW) layer including AlInGaN is on the n-GaN layer 140. A p-GaN layer 180 is on the active layer 160. A p-contact layer 220 is on the p-GaN layer 180. A p-electrode 240 and a pad 260 are formed on the p-contact layer 220.

In the LED shown in FIG. 2, the n-contact 500 may serve two functions. First, the n-contact 500 serves an electrical function as a conductive material. Second, the re-contact 500 can also serve to reflect photons emitted from the active layer 160 to the re-contact 500. This increases the brightness of the LED since photons that would otherwise be absorbed or wasted in some other manner would reflect off of the n-contact 500 and emit light. A material having good reflective characteristics such as that of a mirror can be used as the n-contact 500. One such example is a polished aluminum layer. Such reflective characteristics are described in more detail in an application entitled "DIODE HAVING HIGH BRIGHTNESS AND METHOD THEREOF" by Myung Cheol Yoo, U.S. patent application Ser. No. 09/905,969, filed on Jul. 17, 2001 (now U.S. Pat. No. 7,067,849), by the same assignee as the present application, the entirety of which contents is hereby incorporated by reference in this application. The material for the re-contact 500 is discussed in detail below.

A benefit of this vertical structure LED of the present invention is the significant reduction in the size of the LED chip as compared to the lateral structure of the conventional LED. Due to its small chip size, significantly more chips can be formed on the same size wafer, such as sapphire. Moreover, the number of process steps for forming the vertical structure LED of the present invention is reduced, as discussed in more detail below. FIGS. 3-8 schematically illustrate a process for manufacturing vertical structure GaN-based light emitting diodes (LEDs) according to the present invention. In order to fabricate GaN-based LEDs, sapphire substrate has been generally used since sapphire is very stable and relatively inexpensive. The epitaxial layer quality of the various GaN layers grown on sapphire substrate is superior to other substrate materials due to their thermal stability and the similar crystal structure of the GaN.

Figure 3:
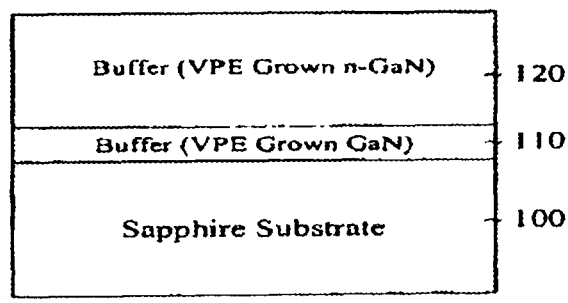
FIGS. 3-8 show the manufacturing steps for forming the light emitting diode according to the present invention.

Referring to FIG. 3, a buffer layer 120, is formed on a transparent substrate 100, beneficially a sapphire substrate. The buffer layer 120, which eventually replaces the function of the sapphire substrate 100, may be formed as one, two or three layers. For example, the buffer layer 120 may have only the n-GaN layer that is grown by VPE. For a two layer buffer layer, a first layer of GaN layer 110 is grown on the sapphire substrate such as by VPE and a second layer of an n-GaN layer 120 is grown on the GaN layer 110 such as by VPE. For a three layer buffer layer, a first layer of GaN layer 110 is grown on the sapphire substrate such as by VPE, a second layer of an undoped GaN layer 130 is grown on the first layer of GaN layer 110 such as by VPE, and a third layer of an n-GaN layer 120 is grown on the undoped GaN layer 130 such as by VPE.

The GaN layer 110 may be formed to have a thickness in a range of about 40-50 nm. The undoped GaN layer 130 may be formed to have a thickness in a range of about 30-40 .mu.m. The n-GaN layer 120 may be formed to have a thickness of about 1-2 .mu.m. For n-GaN 120, silene gas ($SiH_4$) may be used as the n-type dopant.

Figure 4:
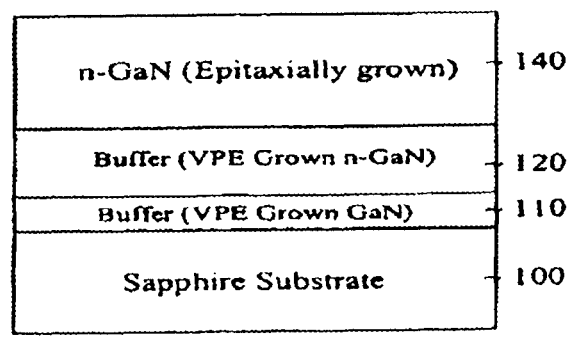

Referring to FIG. 4, an n-type epitaxial layer such as n-GaN 140 is epitaxially grown on the buffer layer 120 by a metal organic chemical vapor deposition (MOCVD) method. Beneficially, a chemical cleaning step (not shown in the figure) of the buffer layer 120 grown by VPE method can be added prior to growing the n-GaN layer 140 by MOCVD method in order to obtain a good quality of the n-GaN epitaxial layer 140. In this instance, the n-GaN layer 140 was doped with silicon (Si) with a doping concentration of about $10^{17}$ cm$^{-3}$ or greater.

Figure 5:
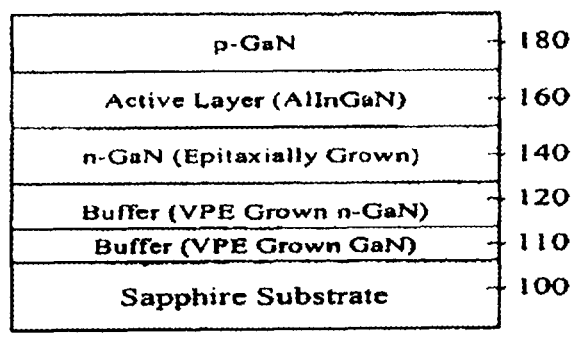

Referring to FIG. 5, an active layer 160 such as an AlInGaN multiple quantum well (MQW) layer is formed by MOCVD method on the n-GaN layer 140. The active layer 160 may be of any suitable structure including a single quantum well layer or a double hetero structure. In this instance, the amount of indium (In) determines whether the diode takes on a green color or a blue color. For an LED with blue light, about 22% of indium may be used. For an LED with green light, about 40% of indium may be used. The amount of indium used may be varied depending on the desired wavelength of the blue or green color. Subsequently, a p-GaN layer 180 is formed by MOCVD method using, for example, $CP_2Mg$ as a p-type dopant on the active layer 160. In this instance, the p-GaN layer 180 was doped with magnesium (Mg) with a doping concentration of about $10^{17}$cm$^3$ or greater.

Figure 6A:
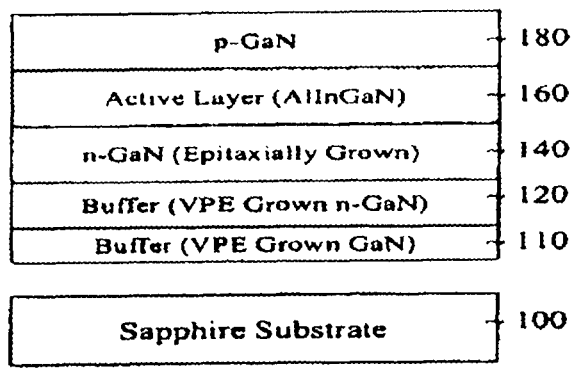

Referring to FIG. 6A, the sapphire substrate 100 is separated from other layers preferably by a laser lift-off method. Other suitable techniques may be used to separate the sapphire substrate 100 from the other layers. The other layers include the buffer layer 120, n-GaN layer 140, active layer 160, and the p-GaN layer 180. By removing the sapphire substrate 100, which is an electrical insulator, from the device, an n-metal contact can be formed under the n-type GaN buffer layer 120, which is an electrical conductor.

Figure 6B:
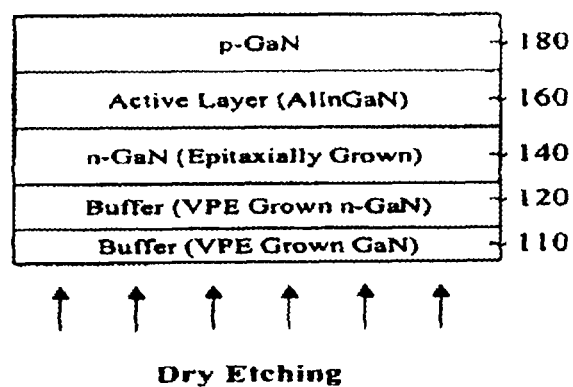
Figure 7:
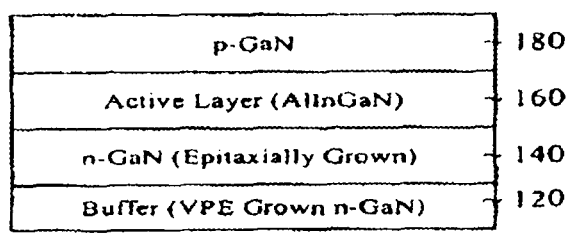

Referring to FIG. 6B, after the substrate 100 is removed, the layers below the buffer layer 120 may be removed as well using, for example, dry etching. This step will expose the n-GaN buffer layer 120 that will be electrically attached to the n-contact 500, as shown in FIG. 8.

Figure 8:
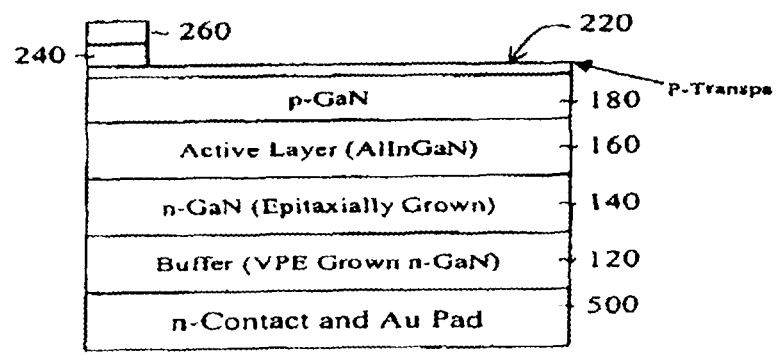

Referring to FIG. 8, a transparent conductive layer 220 is formed on the p-GaN layer 180. The transparent conductive layer 220 may be made of any suitable material including, for example, indium-tin-oxide (ITO). A p-type electrode 240 is formed on the transparent conductive layer 220. An n-type electrode 500 is formed on the bottom of the buffer layer 120. The p-type electrode 240 may be made of any suitable material including, for example, Ni/Au, Pd/Au, Pd/Ni and Pt. The n-type electrode 500 may be made of any suitable material including, for example, Ti/Al, Cr/Au and Ti/Au. A pad 260 is formed on the p-type electrode 240. The pad 260 may be made of any suitable material including, for example, Au. The pad 260 may have a thickness of about 0.5 .mu.m or higher. Unlike the p-type electrode 240, the n-type electrode 500 does not require a pad, although one can be used, if desired.

Figure 9:
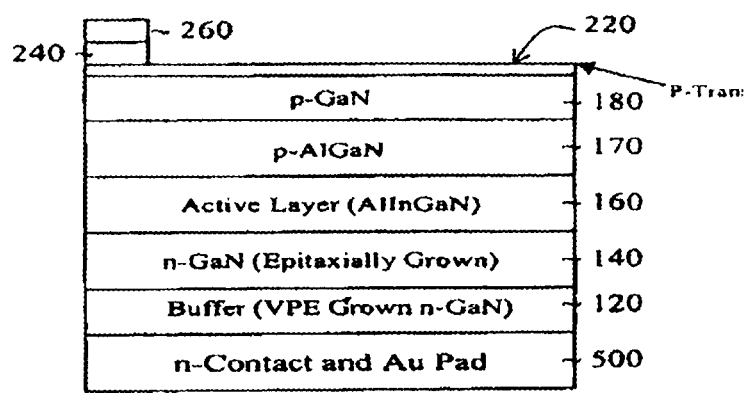
FIG. 9 shows another embodiment of the vertical structure LED of the present invention.

FIG. 9 shows an alternative embodiment in which a cladding layer 170 is formed between the p-GaN layer 180 and the active layer 160. The cladding layer 170 is preferably formed with p-AlGaN by MOCVD method using $CP_2Mg$ as a p-type dopant. The cladding layer 170 enhances the performance of the LED device.

According to the present invention, there are many advantages compared with both conventional lateral and vertical GaN-based LEDs. Compared with the conventional lateral structure GaN-based LEDs, the manufacturing process according to the present invention increases the number of LED devices fabricated on a given wafer size, since there is no n-metal contact on top of the devices. The device dimension can be reduced, for example, from 250.times.250 .mu.m to about 160.times.160 .mu.m or smaller. By not having the n-metal contact above the substrate or on top of the device, according to the present invention, the manufacturing process is significantly simplified. This is because additional photolithography and etch processes are not required to form the n-metal contact and there is no plasma damage which are often sustained on the n-GaN layer in the conventional lateral structure GaN-based LEDs. Furthermore, the LED devices fabricated according to the present invention are much more immune to static electricity, which makes the LED more suitable for high voltage applications than conventional lateral structure LED devices:

In general, the deposition method of VPE is much simpler and requires less time to grow epitaxial layers with certain thickness than the deposition method of MOCVD. Therefore, the fabrication process is more simplified and the process time is more reduced even compared with those of the conventional vertical GaN-based LEDs in that the manufacturing process according to the present invention does not require growing buffer and n-GaN layers by MOCVD method. In total, the number of manufacturing steps is reduced, for example, from 28 steps with the conventional method to 15 steps with the method of the present invention. In addition, the manufacturing cost is reduced considerably compared with the conventional vertical structure GaN-based LEDs, which use silicon carbide (SiC) as a substrate, which can be 10 times more expensive than that of a sapphire substrate. Moreover, the method according to the present invention provides better metal adhesion between bonding pads and both n and p contacts than the conventional vertical structure GaN-based LEDs.

With the present invention, mass production of GaN-based LEDs at an inexpensive cost is made possible without sacrificing or changing the desired characteristics of the LEDs. Moreover, the vertical structure of the LED of the present invention, with an added feature of a reflective bottom n-contact, enhances the brightness of the LED. This invention can be applied not only to the current commercially available blue, green, red and white LEDs but also to other suitable devices.

Although the present invention has been described in detail with reference to GaN technology diodes, the present invention can easily be applied to other types of diodes including red LEDs and laser diodes including Vertical Cavity Surface Emitting Lasers (VCSELs).

It will be apparent to those skilled in the art that various modifications and variation can be made in the present invention without departing from the split or scope of the invention. Thus, it is intended that the present invention cover the modifications and variations of this invention provided they come within the scope of the appended claims and their equivalents.

What is claimed is:

1. A vertical light emitting device, comprising:
   a first pad;
   a first metal layer on the first pad, the first metal layer including titanium and gold;
   a gallium-nitride based semiconductor structure on the first metal layer, the gallium-nitride based semiconductor structure including:
   a first type semiconductor layer on the first metal layer,
   an active layer on the first type semiconductor layer; and
   a second type semiconductor layer,
   wherein the active layer includes multiple quantum well layer having indium;
   a second metal layer on the second type semiconductor layer, the second metal layer including platinum; and
   a second pad on the second metal layer.

2. The light emitting device according to claim 1, wherein the first type semiconductor layer is doped with silicon with a doping concentration of $10^{17}$ cm$^{-3}$ or greater.

3. The light emitting device according to claim 2, wherein the second type semiconductor layer is doped with magnesium with a doping concentration of $10^{17}$ cm$^{-3}$ or greater.

4. The light emitting device according to claim 3, further comprising an undoped gallium-nitride layer on the first metal layer.

5. The light emitting device according to claim 4, wherein the undoped gallium-nitride layer is a buffer layer.

6. The light emitting device according to claim 4, wherein a thickness of the undoped gallium-nitride layer is 30 μm to 40 μm.

7. The light emitting device according to claim 3, wherein the active layer includes 22% to 40% of indium composition.

8. The light emitting device according to claim 3, wherein the active layer comprises aluminum-indium-gallium-nitride.

9. The light emitting device according to claim 3, further comprising a transparent conductive layer on the second type semiconductor layer.

10. The light emitting device according to claim 9, wherein the transparent conductive layer comprises oxide such as indium-tin-oxide.

11. The light emitting device according to claim 1, wherein the second pad on the second metal layer has a thickness of 0.5 μm or higher.

12. The light emitting device according to claim 1, wherein the first type is n-type and the second type is p-type.

13. The light emitting device according to claim 1, wherein the first pad on which the first metal layer is located is at a bottom of the device.

14. The light emitting device according to claim 1, wherein a width of the first metal layer is greater than a width of the second pad.

15. The light emitting device according to claim 1, wherein the first metal layer is overlapped with the second pad in a first direction at a cross-sectional edge of the vertical light emitting device, the first direction being a thickness direction of the vertical light emitting device.

16. The light emitting device according to claim 1, further comprising a cladding layer between the active layer and the second type semiconductor layer.

17. The light emitting device according to claim 16, wherein the cladding layer comprises AlGaN.

* * * * *